(12) United States Patent
Han et al.

(10) Patent No.: US 12,194,735 B2
(45) Date of Patent: Jan. 14, 2025

(54) INKJET PRINTING APPARATUS WITH MOVABLE INK-RECEIVING MEMBER

(71) Applicant: Samsung Display Co., Ltd., Yongin-Si (KR)

(72) Inventors: Jeong Won Han, Seongnam-si (KR); Myung Soo Huh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 106 days.

(21) Appl. No.: 17/853,693

(22) Filed: Jun. 29, 2022

(65) Prior Publication Data

US 2023/0148067 A1 May 11, 2023

(30) Foreign Application Priority Data

Nov. 8, 2021 (KR) .................. 10-2021-0152235

(51) Int. Cl.
*B41J 11/06* (2006.01)
*B41J 2/01* (2006.01)
*B41J 2/11* (2006.01)
*B41J 3/407* (2006.01)
*B41J 11/00* (2006.01)
*B41J 25/00* (2006.01)
*G02F 1/13* (2006.01)
*H10K 71/13* (2023.01)
*B41J 2/165* (2006.01)

(52) U.S. Cl.
CPC ............... *B41J 11/06* (2013.01); *B41J 2/01* (2013.01); *B41J 2/11* (2013.01); *B41J 3/40731* (2020.08); *B41J 11/0021* (2021.01); *B41J 11/00214* (2021.01); *B41J 11/00216* (2021.01); *B41J 11/0045* (2013.01); *B41J 25/001* (2013.01); *G02F 1/1303* (2013.01); *H10K 71/135* (2023.02); *B41J 2/16526* (2013.01); *B41J 3/4073* (2013.01); *B41J 2202/09* (2013.01)

(58) Field of Classification Search
CPC ...... B41J 11/06; B41J 2/16526; B41J 3/4073; B41J 2/01; B41J 3/40731; B41J 11/00214; B41J 11/00216; B41J 2/11; B41J 11/0021; B41J 11/0045; B41J 25/001; B41J 2202/09; G02F 1/1303; H10K 71/135
See application file for complete search history.

(56) References Cited

U.S. PATENT DOCUMENTS

| 11,285,723 | B2 | 3/2022 | Han |
| 2019/0232689 | A1* | 8/2019 | Ohashi ............... B41J 13/0027 |
| 2020/0101414 | A1* | 4/2020 | Kang .................. B41J 2/17513 |

(Continued)

FOREIGN PATENT DOCUMENTS

| KR | 10-2007-0070506 A | 7/2007 |
| KR | 10-2008-0050119 A | 6/2008 |

(Continued)

*Primary Examiner* — Henok D Legesse
(74) *Attorney, Agent, or Firm* — Innovation Counsel LLP

(57) ABSTRACT

An inkjet printing apparatus may form a material layer on a substrate. The inkjet printing apparatus includes a stage, an ink-receiving member, and an inkjet head. The stage may support the substrate. The inkjet head overlaps at least one of the stage and the ink-receiving member, may provide a first set of ink to the substrate, and may provide a second set of ink to the ink-receiving member when the substrate is supported by the stage.

18 Claims, 17 Drawing Sheets

(56) References Cited

U.S. PATENT DOCUMENTS

2020/0391512 A1* 12/2020 Han ................... B41J 2/16526
2022/0169026 A1   6/2022 Han
2022/0305792 A1*  9/2022 Ishii ................... B41J 2/16526

FOREIGN PATENT DOCUMENTS

| KR | 10-2018-0102489 A | 9/2018 |
| --- | --- | --- |
| KR | 10-2020-0095816 A | 8/2020 |
| KR | 10-2020-0143539 A | 12/2020 |
| KR | 10-2021-0003358 A | 1/2021 |

* cited by examiner

INKJET PRINTING APPARATUS WITH MOVABLE INK-RECEIVING MEMBER

CROSS-REFERENCE TO RELATED APPLICATION

This application claims priority to Korean Patent Application No. 10-2021-0152235 filed in the Korean Intellectual Property Office on Nov. 8, 2021; the Korean Patent Application is incorporated by reference.

BACKGROUND

1. Field

The technical field relates to an inkjet printing apparatus.

2. Description of the Related Art

A display device may display images in response to input signals. Modern display devices include liquid crystal display (LCD) devices and an organic light emitting diode (OLED) display devices. Display devices are included in various electronic devices such as mobile phones, navigation devices, digital cameras, electronic books, portable game machines, and various terminals.

In the process of manufacturing a display device, an inkjet printing apparatus may drop an organic compound on a substrate to form an organic emission layer. The inkjet printing process may be simple, time-saving, material-saving, and a cost-saving.

In the inkjet printing process, when the printing is paused, the ink inside the nozzle does not flow and becomes stagnant. Accordingly, the viscosity of the ink may increase. As a result, and problems such as a discharge failure and/or a distortion of the discharge direction may occur when the printing is resumed.

The Background section facilitates understanding of the background of the described technology and may contain information that does not form the prior art that is already known in this country to a person of ordinary skill in the art.

SUMMARY

Embodiments are related to an inkjet printing apparatus capable of maintaining sufficient fluidity of the ink in the nozzle in the inkjet printing process.

An inkjet printing apparatus according to an embodiment includes: a stage capable of seating a substrate; an auxiliary member positioned on the stage; and an inkjet head capable of moving on the stage and the auxiliary member.

The auxiliary member may be positioned on both edges above the stage.

At least one of the stage and the inkjet head may be capable of moving in at least one of a first direction and a second direction perpendicular to the first direction.

The inkjet head may discharge an ink on the substrate and the auxiliary member.

The inkjet printing apparatus according to an embodiment further includes a fixing member positioned on the side of the stage and fixing the auxiliary member to the stage.

The fixing member may be positioned on both edges of the auxiliary member.

The fixing member positioned on one edge of the auxiliary member may be capable of unwinding the auxiliary member, and the fixing member positioned on the other edge of the auxiliary member may be capable of winding the auxiliary member.

The fixing member may include: a first roller and a second roller; a supporting member supporting the first roller and the second roller; and a transferring member moving the supporting member in a third direction perpendicular to the first direction and the second direction.

The inkjet printing apparatus according to an embodiment may further include a drying member attached to the fixing member.

The drying member may irradiate ultraviolet rays or infrared rays.

The inkjet printing apparatus according to an embodiment may further include a suction member positioned between the stage and the auxiliary member.

The suction member may include at least one of a vacuum chuck, a porous chuck, an electrostatic chuck, and an adhesive chuck.

The auxiliary member may be positioned on one edge above the stage.

The inkjet printing apparatus according to an embodiment may further include a plurality of floating holes positioned on the stage, and the auxiliary member may be positioned at the center of the stage.

The substrate may be positioned over a plurality of floating holes, and the substrate may be floated from the stage or fixed to the stage by a plurality of floating holes.

The inkjet printing apparatus according to an embodiment may further include a substrate moving member fixed to one edge of the substrate, and the substrate moving member may move the substrate in the first direction, and the inkjet head may move in the second direction perpendicular to the first direction.

When the substrate is positioned between the inkjet head and the auxiliary member, the inkjet head may discharge the ink on the substrate, and when the inkjet head is positioned directly on the auxiliary member, the inkjet head may discharge the ink on the auxiliary member.

The inkjet printing apparatus according to an embodiment may further include a fixing member positioned on the side of the stage and fixing the auxiliary member to the stage, the fixing member may be positioned on both edges of the auxiliary member, the fixing member positioned on one edge of the auxiliary member may be capable of unwinding the auxiliary member, and the fixing member positioned on the other edge of the auxiliary member may be capable of winding the auxiliary member.

The inkjet printing apparatus according to an embodiment may further include a drying member attached to the fixing member.

The inkjet printing apparatus according to an embodiment may further include a suction member positioned between the stage and the auxiliary member.

An embodiment may be related to an inkjet printing apparatus for forming a material layer on a substrate. The inkjet printing apparatus may include a stage, a first ink-receiving member, and an inkjet head. The stage may support the substrate. The first ink-receiving member may be narrower than the substrate. The inkjet head may overlap at least one of the stage and the first ink-receiving member, may provide a first set of ink to the substrate, and may provide a second set of ink to the first ink-receiving member when the substrate is supported by the stage.

The inkjet printing apparatus may include a second ink-receiving member. The stage may support the substrate between the first ink-receiving member and the second ink-receiving member. The inkjet head may provide a third set of ink to the second ink-receiving member when the substrate is positioned on the stage.

At least one of the stage and the inkjet head may move in at least one of a first direction and a second direction perpendicular to the first direction.

The inkjet head may discharge no ink on the substrate when providing the second set of ink to the first ink-receiving member.

The inkjet printing apparatus may include a first fixing member neighboring the stage and at least partially supporting the first ink-receiving member.

The inkjet printing apparatus may include: a second fixing member partially supporting the first ink-receiving member. The stage may be positioned between the first fixing member and the second fixing member.

The first fixing member may unwind the first ink-receiving member when the second fixing member winds the first ink-receiving member.

The first fixing member may include a first roller directly contacting the first ink-receiving member, a second roller directly contacting the first-ink receiving member, a supporting member supporting the first roller and the second roller, and a transferring member for moving the supporting member relative to the stage in a third direction perpendicular to the first direction and the second direction.

The inkjet printing apparatus may include a drying member attached to the first fixing member, positioned farther from the inkjet head than the first ink-receiving member is, and configured to facilitate drying of the second set of ink.

The drying member may irradiate ultraviolet rays or infrared rays.

The inkjet printing apparatus may include a securing member positioned between the stage and the first ink-receiving member for securing a section of the first ink-receiving member in place on the stage. The securing member may release the section of the first ink-receiving member from the stage.

The securing member may include at least one of a vacuum chuck, a porous chuck, an electrostatic chuck, and an adhesive chuck.

The first ink-receiving member may be positioned between an edge of the stage and the substrate when the substrate is supported by the stage.

The inkjet printing apparatus may include holes positioned on the stage for changing an amount of air between the stage and the substrate. The first ink-receiving member may be positioned two opposite edges of the stage.

The substrate may overlap a first subset of the holes, may expose a second subset of the holes, and may be levitated from the stage or attached to the first subset of holes according to an operation of the first subset of holes.

The inkjet printing apparatus may include a substrate moving member fixed to at least one edge of the substrate and moving the substrate in a first direction. The inkjet head may move in a second direction perpendicular to the first direction and/or may move in a lengthwise direction of the first ink-receiving member.

When the substrate is positioned between the inkjet head and the first ink-receiving member, the inkjet head may discharge the first set of ink on the substrate.

When the substrate exposes the first ink-receiving member to the inkjet head, the inkjet head may discharge the second set of ink on the first ink-receiving member.

The inkjet printing apparatus may include a first fixing member supporting a first section of the first ink-receiving member and may include a second fixing member supporting a second section of the first ink-receiving member. A third section of the first ink-receiving member may move over the stage when the first fixing member unwinds the first section of the first ink-receiving member and when the second fixing member winds the second section of the first ink-receiving member.

The inkjet printing apparatus may include a drying member attached to the first fixing member, positioned farther from the inkjet head than the first ink-receiving member, and configured to facilitate drying of the second set of ink.

The inkjet printing apparatus may include a securing member positioned between the stage and the first ink-receiving member, positioned between the first subset of holes and the second subset of holes, and configured to secure the first ink-receiving in place on the stage.

According to embodiments, it is possible to prevent the ink in the nozzle from undesirably drying in the inkjet printing process. Since the characteristics of the discharged ink may be maintained, the characteristics of the layer produced from the ink may be desirably uniform. The quality of the display device formed using the inkjet printing apparatus may be satisfactory.

DETAILED DESCRIPTION

Figure 1:
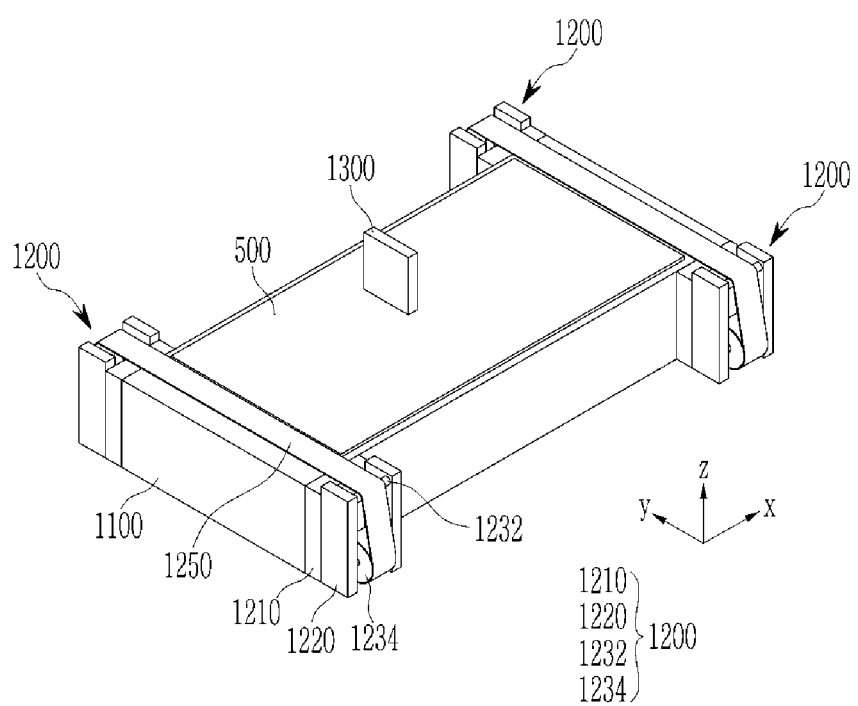
FIG. 1 is a perspective view showing an inkjet printing apparatus according to an embodiment.

Example embodiments are described with reference to the accompanying drawings. The described embodiments may be modified in various ways.

The same elements or equivalents may be denoted by the same reference numerals.

In the drawings, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on" a second element, the first element can be directly on the second element, or one or more intervening elements may be present between the first element and the second element. When a first element is referred to as being "directly on" a second element, there are no intended intervening elements (except for environmental elements such as air) present between the first element and the second element.

Unless explicitly described to the contrary, the word "comprise", and variations such as "comprises" or "comprising", may indicated the inclusion of stated elements but may not indicate the exclusion of any other elements.

The term "auxiliary member" may mean "ink-receiving member." The term "member" may mean "member set" or "set of members." The term "fix" may mean "support" and/or "secure." The term "pattern" may mean "material layer" or "material layer with features." The term "stage" may mean "support unit" or "platform."

FIG. 1 is a perspective view showing an inkjet printing apparatus according to an embodiment.

The inkjet printing apparatus includes a stage 1100, an auxiliary member 1250 positioned on the stage 1100, and an inkjet head 1300 movable on the stage 1100 and the auxiliary member 1250.

The stage 1100 may support the substrate 500. The substrate 500 may be moved in the first direction x and/or the second direction y. The second direction y may be perpendicular to the first direction x.

The auxiliary member 1250 may be positioned adjacent to the substrate when the substrate 500 is mounted on the stage 1100. The substrate 500 and the auxiliary member 1250 may not substantially overlap each other. The substrate 500 and the auxiliary member 1250 may be spaced by a predetermined distance in the first direction x. The substrate 500 and the auxiliary member 1250 may overlap each other in the third direction z. The substrate 500 and the auxiliary member 1250 may be spaced by a predetermined distance in the third direction z. The third direction z may be perpendicular to the first direction x and the second direction y.

The auxiliary member 1250 may include a polyimide film and/or an ultra-thin glass (UTG) film. The ultra-thin glass may be foldable and flexible.

The inkjet head 1300 may be moved in the first direction x and/or the second direction y. At least one of the stage 1100 and the inkjet head 1300 may be moved relative to the other. The stage 1100 may move in the first direction x and the second direction y. The stage 1100 may move in the first direction x, and the inkjet head 1300 may move in the second direction y. The stage 1100 may move in the second direction y, and the inkjet head 1300 may move in the first direction x. The inkjet head 1300 may move in the first direction x and the second direction y.

The inkjet head 1300 includes a nozzle, and ink may be discharged from the nozzle. The discharged ink may be provided (e.g., dropped) on the substrate 500 (positioned on the stage 1100) to form a predetermined pattern. The ink discharged from the inkjet head 1300 onto the substrate 500 may form an organic emission layer and/or a quantum dot color filter. Through the movement of the stage 1100 and/or the inkjet head 1300, a pattern may be formed on the substrate 500. The inkjet head 1300 may form a strip of the pattern on the substrate 500 by moving from one edge of the substrate 500 to the other edge in the first direction x, and the pattern may be formed on the substrate 500 after multiple strips arranged in the second direction y have been formed. In the process of moving the inkjet head 1300 in the second direction y to form the next strip, if the ink discharge is paused, drying of the ink may occur. According to an embodiment, the inkjet head 1300 is positioned on the auxiliary member 1250 when moving in the second direction y, and the ink discharge may be continuously performed, for preventing the ink inside the inkjet head 1300 from drying out. The inkjet head 1300 may provide/discharge ink on the auxiliary member 1250 when providing no ink on the substrate 500 (which is supported by the stage 1100).

The auxiliary member 1250 may be supported and/or fixed by a fixing member 1200 positioned at one or more sides of the stage 1100. The fixing member 1200 may include a first roller 1232, a second roller 1234, a supporting member 1220, and a transferring member 1210.

Each of the first roller 1232 and the second roller 1234 may be rotatable between two supporting members 1220. The first roller 1232 may be positioned higher than the second roller 1234. The auxiliary member 1250 is wound on the second roller 1234, and the auxiliary member 1250 may be further wound or unwound through the rotation of the second roller 1234. The first roller 1232 supports the auxiliary member 1250, and when the auxiliary member 1250 is moved, the first roller 1232 rotates to minimize the frictional force acting on the auxiliary member 1250.

The two supporting members 1220 are connected to the transferring member 1210. The two supporting members 1220 may move in the third direction z by the transferring member 1210. The supporting member 1220 may be moved upwardly or downwardly by the transferring member 1210 relative to the stage 1100. When the inkjet head 1300 discharges the ink to the auxiliary member 1250, the supporting member 1220 may be moved downward so that the auxiliary member 1250 is fixed to (and is stabilized by) the stage 1100. When the auxiliary member 1250 is wound or unwound on the second roller 1234, the supporting member 1220 may be moved upwards so that the auxiliary member 1250 may be moved smoothly.

Two auxiliary members 1250 may be respectively positioned at two edges of the stage 1100 that are opposite each other in the first direction x. Each auxiliary member 1250 may extend lengthwise in the second direction y. Two ends of each auxiliary member 1250 may be supported and/or fixed by two fixing members 1200. The inkjet printing apparatus may include four fixing members 1200 for fixing two auxiliary members 1250. In a pair of fixing members 1200, when one fixing member 1200 winds the auxiliary member 1250, and the other fixing member 1200 may unwind the auxiliary member 1250.

FIGS. 2 to 6 are perspective views showing a process in which an inkjet head is moved in an inkjet printing process according to an embodiment. FIG. 7 is a perspective view showing a process in which an auxiliary member is moved in an inkjet printing process according to an embodiment.

Figure 2:
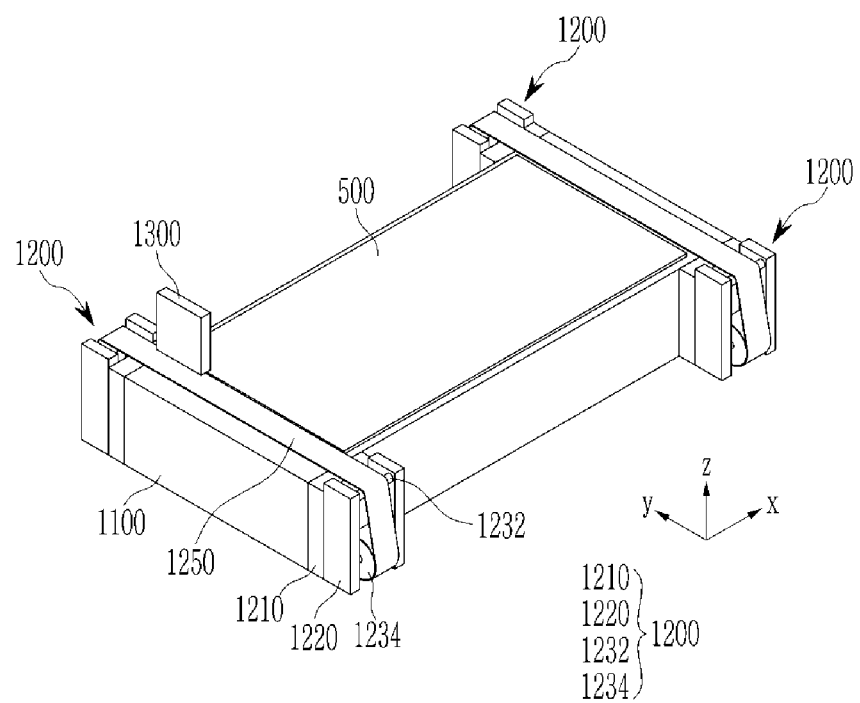
FIG. 2, FIG. 3, FIG. 4, FIG. 5, and FIG. 6 are perspective views showing a process in which an inkjet head is moved and/or moves in an inkjet printing process according to an embodiment.

Referring to FIG. 2, the inkjet head 1300 may be positioned on an auxiliary member 1250 before forming a pattern on the substrate 500. The inkjet head 1300 may overlap a left auxiliary member 1250. The inkjet head 1300 may overlap an edge of the auxiliary member 1250 and an edge of the stage 1100 that are close to each other. The inkjet head 1300 may be positioned at a left rear corner of the stage 1100.

When the inkjet head 1300 overlaps the auxiliary member 1250, the inkjet head 1300 may discharge ink onto the auxiliary member 1250. Therefore, the ink in the inkjet head 1300 may keep flowing and is not dried.

Figure 3:
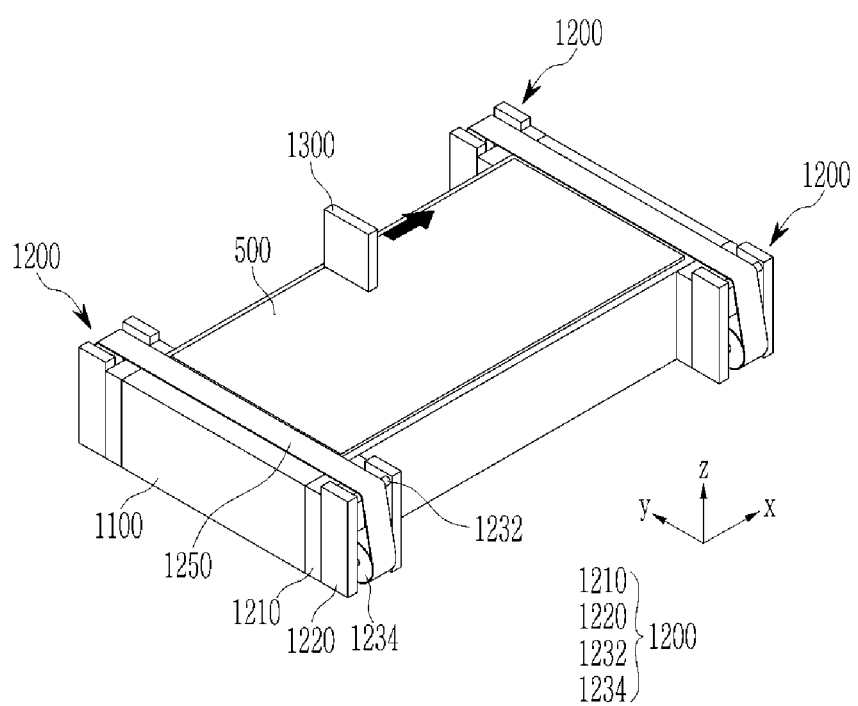

Referring to FIG. 3, the inkjet head 1300 may discharge ink on the substrate 500 when moving in the first direction x. A strip of a predetermined pattern may be formed on the substrate 500 by the discharged ink. Because the pattern on the substrate 500 is formed with substantially fluid ink after the inkjet head 1300 discharges the ink on the auxiliary member 1250, portions of the pattern formed at the beginning of the inkjet printing process may have the same characteristics as other portions of the pattern. Advantageously, the uniformity of the pattern formed on the substrate 500 may be satisfactory.

Figure 4:
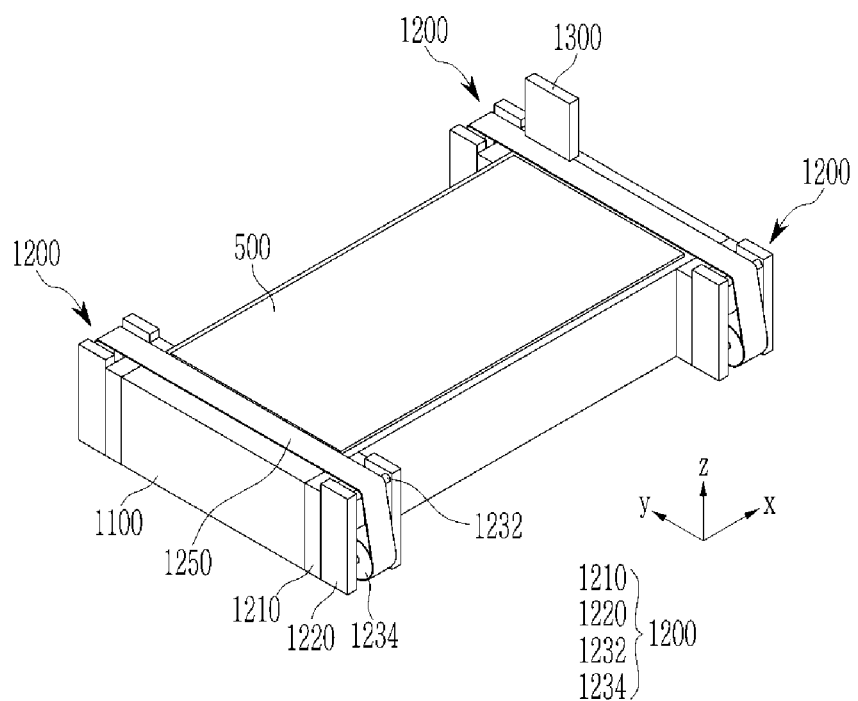

Referring to FIG. 4, when the inkjet head 1300 moves in the first direction x to another edge of the stage 1100, the inkjet head 1300 may overlap a right auxiliary member 1250. The inkjet head 1300 may be positioned at a right rear corner of the stage 1100.

When the inkjet head 1300 overlaps the right auxiliary member 1250, the inkjet head 1300 may continue discharging ink and may provide ink onto the right auxiliary member 1250. The ink discharge may continue even when the inkjet head 1300 does not provide ink onto the substrate 500. Therefore, the ink positioned inside the inkjet head 1300 may continue flowing and may maintain desirable fluidity.

Figure 5:
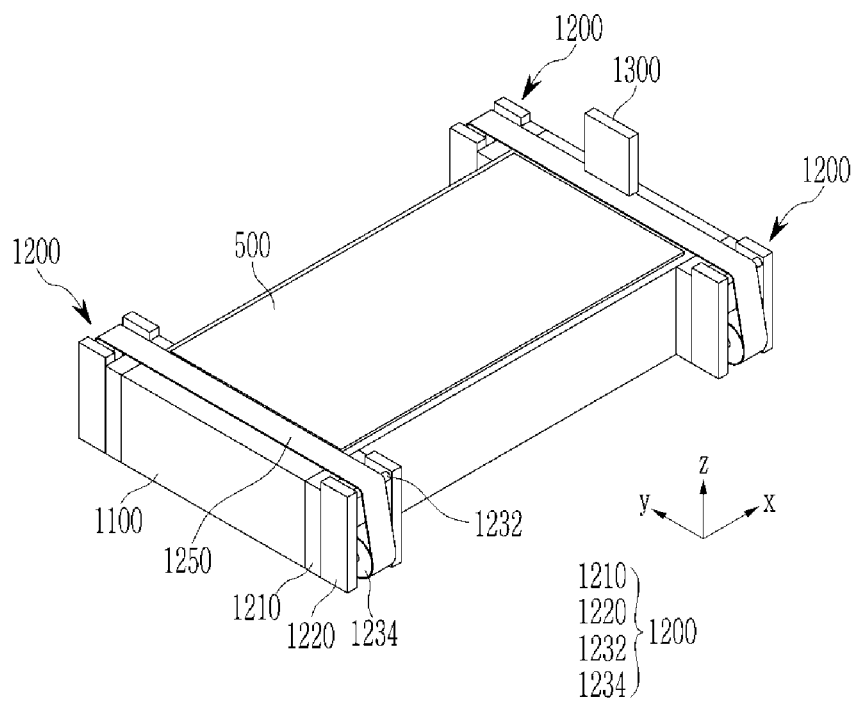

Referring to FIG. 5, the inkjet head 1300 may move forward in the second direction y when overlapping the right auxiliary member 1250. When the inkjet head 1300 is moving on the auxiliary member 1250, the inkjet head 1300 may continue discharging ink onto the auxiliary member 1250.

Figure 6:
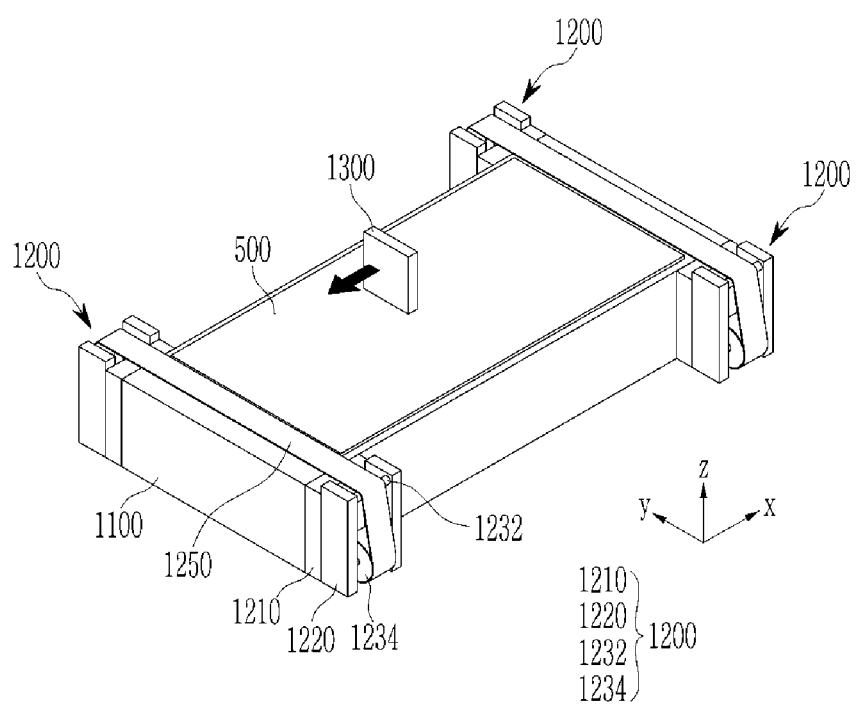
Figure 7:
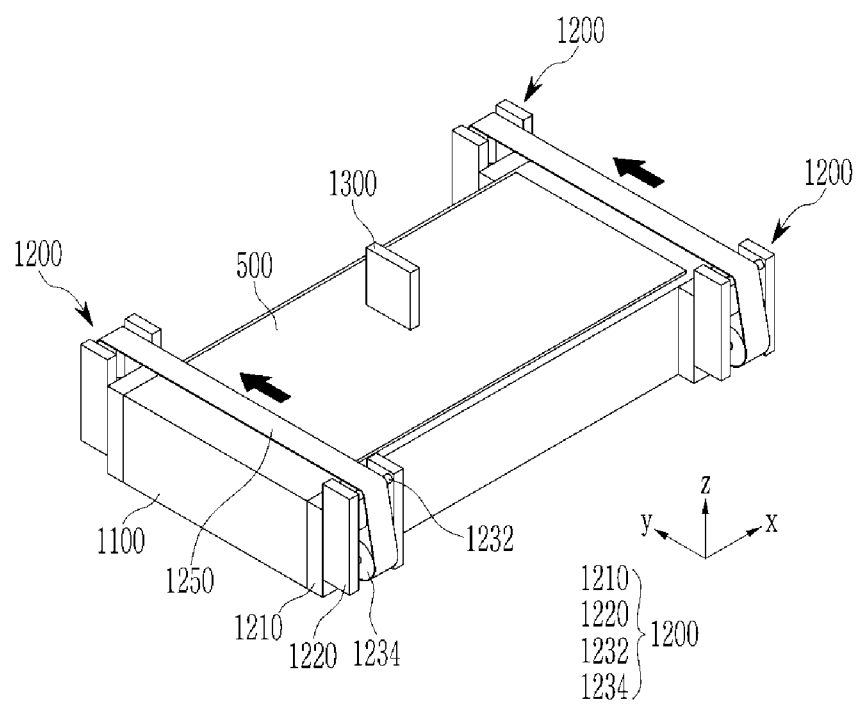
FIG. 7 is a perspective view showing a process in which an auxiliary member is moved and/or moves in an inkjet printing process according to an embodiment.

Referring to FIG. 6, the inkjet head 1300 may discharge the ink on the substrate 500 when moving in the first direction x. The inkjet head 1300 may move leftward, opposite to the movement direction of FIG. 3. A strip of the predetermined pattern may be formed on the substrate 500 by the discharged ink. By providing ink on the substrate 500 after the inkjet head 1300 discharges ink on the auxiliary member 1250, the portion of the pattern formed after the movement direction change of the inkjet head 1300 may have the same characteristics as other portions of the pattern. Accordingly, the uniformity of the pattern formed on the substrate 500 may be satisfactory.

The inkjet printing process may be performed when the stage 1100 is moved. The inkjet printing process may be performed when both the stage 1100 and the inkjet head 1300 are moved.

Referring to FIG. 7, two auxiliary members 1250 positioned at two opposite sides of the stage 1100 are movable. Two ends of each auxiliary member 1250 are respectively supported by two fixing members 1200. Ink may be accumulated on the auxiliary member 1250 during the inkjet printing process. When a predetermined amount of the ink is accumulated on a part of the auxiliary member 1250, the auxiliary member 1250 may be moved such that the part of the auxiliary member 1250 may not further receive ink.

The supporting member 1220 may be moved in the third direction z by the transferring member 1210. The supporting member 1220 may be moved upward to be spaced from the stage 1100.

The first roller 1232 and the second roller 1234 may rotate to move the auxiliary member 1250 backward in the second direction y. The part of the auxiliary member 1250 wound around the front second roller 1234 may be. The rear second roller 1234 may engage more of the auxiliary member 1250. The amount of the auxiliary member 1250 wound around the front second roller 1234 may decrease, and the amount of the auxiliary member 1250 wound around the rear second roller 1234 may increase.

Alternatively or additionally, the auxiliary member 1250 may move forward in the second direction y.

Two auxiliary members 1250 positioned at opposite sides of the stage 1100 may move simultaneously or separately. The two auxiliary members 1250 may move simultaneously at regular time intervals. The amount of the ink accumulated on two auxiliary members 1250 may be different; therefore, the two auxiliary members 1250 may move according to different time intervals. The inkjet printing apparatus may include a sensing member for sensing the amount of the ink accumulated on each auxiliary member 1250, and an auxiliary member 1250 may be moved when a certain amount of ink is accumulated on the auxiliary member 1250.

Figure 8:
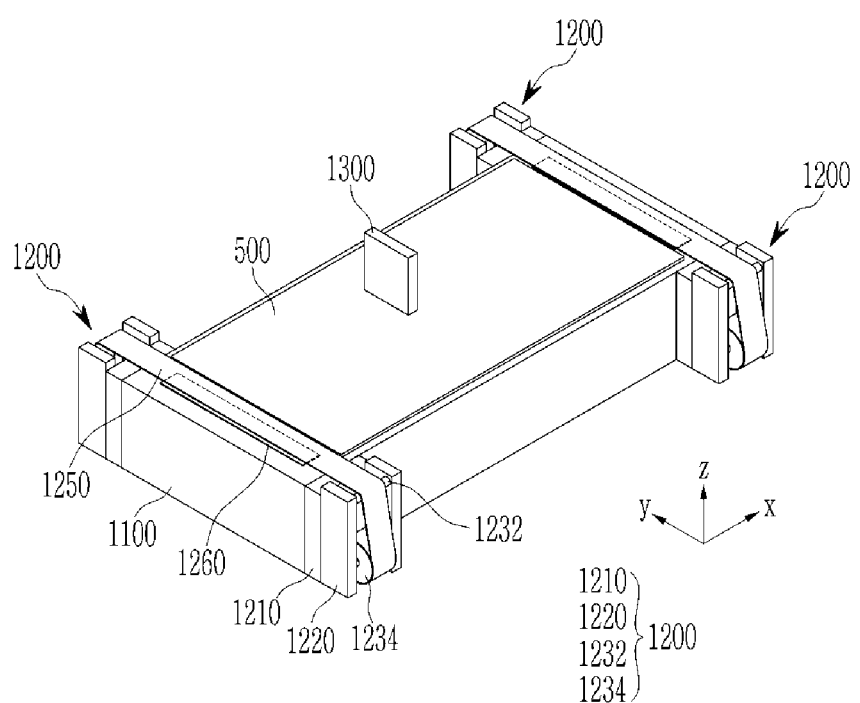
FIG. 8 is a perspective view showing an inkjet printing apparatus according to an embodiment.

FIG. 8 is a perspective view showing an inkjet printing apparatus according to an embodiment. Some features related to the inkjet printing apparatus shown in FIG. 8 may be identical to or analogous to some features described with reference to one or more of FIGS. 1 to 7.

Referring to FIG. 8, the inkjet printing apparatus includes a stage 1100, an auxiliary member 1250 positioned on the stage 1100, and an inkjet head 1300 movable on the stage 1100 and the auxiliary member 1250.

The inkjet printing apparatus may further include a securing member 1260 positioned above the stage 1100.

The securing member 1260 may be positioned between the stage 1100 and the auxiliary member 1250. The securing member 1260 may suck the air positioned between the stage 1100 and the auxiliary member 1250 so that the auxiliary member 1250 is fixed to the stage 1100. The auxiliary member 1250 may be substantially thin and may be affected by the surrounding airflow. The securing member 1260 may secure the auxiliary member 1250 in place and may prevent the auxiliary member 1250 from failing off the stage 1100. The securing member 1260 may secure the auxiliary member 1250 in place when ink is provided on the auxiliary member 1250. The securing member 1260 may release (and may not secure) the auxiliary member 1250 in place when (or immediately before) the auxiliary member 1250 is moved in the second direction y and/or the third direction z relative to the stage 1100.

The securing member 1260 may include at least one of a vacuum chuck, a porous chuck, an electrostatic chuck, an adhesive chuck, and the like.

Figure 9:
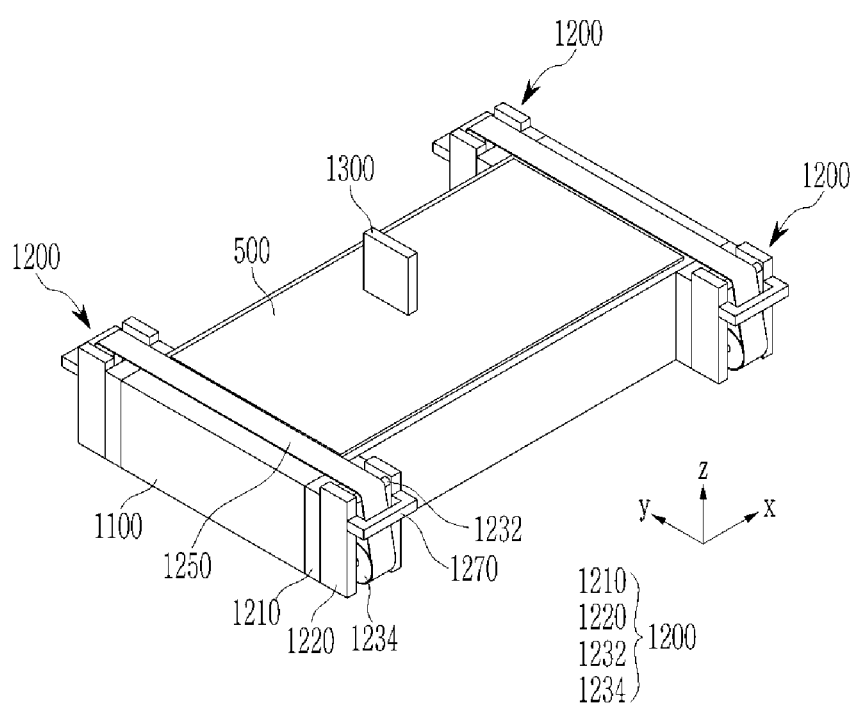
FIG. 9 is a perspective view showing an inkjet printing apparatus according to an embodiment.

FIG. 9 is a perspective view showing an inkjet printing apparatus according to an embodiment. Some features related to the inkjet printing apparatus shown in FIG. 9 may be identical to or analogous to some features described with reference to one or more of FIGS. 1 to 7.

Referring to FIG. 9, the inkjet printing apparatus includes a stage 1100, an auxiliary member 1250 positioned on the stage 1100, and an inkjet head 1300 movable on the stage 1100 and the auxiliary member 1250.

The auxiliary member 1250 may be supported and/or fixed by the fixing member 1200 positioned at a side of the stage 1100. The inkjet printing apparatus may further include a drying member 1270 attached to the fixing member 1200.

The drying member 1270 may be fixed to two supporting members 1220 of the fixing member 1200. The drying member 1270 may be positioned at a position/height between the first roller 1232 and the second roller 1234 or at an alternative position significantly spaced from the inkjet head 1300. The drying member 1270 may be positioned farther from the inkjet head 1300 than the auxiliary member 1250.

The drying member 1270 may irradiate ultraviolet rays and/or infrared rays for facilitating and/or accelerating drying of ink on the auxiliary member 1250.

One or more drying members 1270 may be formed on one or more of the four fixing members 1200. The movement direction of the auxiliary member 1250 may be the backward direction or the forward direction, and two drying members 1270 may be respectively formed on two fixing members 1200 that are opposite each other in the first direction x.

Figure 10:
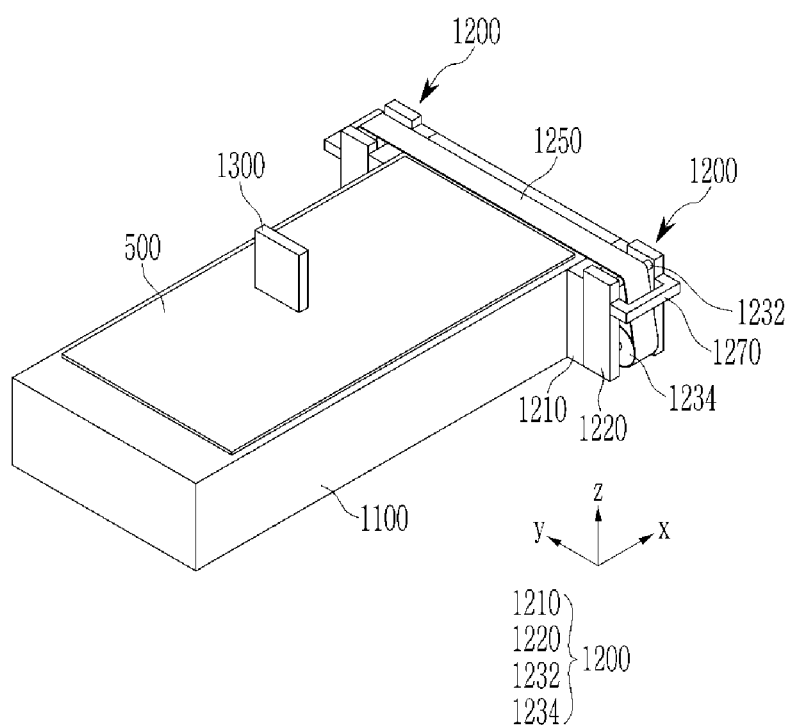
FIG. 10 is a perspective view showing an inkjet printing apparatus according to an embodiment.

FIG. 10 is a perspective view showing an inkjet printing apparatus according to an embodiment. Some features related to the inkjet printing apparatus shown in FIG. 10 may be identical to or analogous to some features described with reference to one or more of FIGS. 1 to 7.

Referring to FIG. 10, the inkjet printing apparatus includes a stage 1100, an auxiliary member 1250 positioned on the stage 1100, and an inkjet head 1300 movable on the stage 1100 and the auxiliary member 1250.

The inkjet printing apparatus may include only one auxiliary member 1250. The auxiliary member 1250 may be positioned at one edge of the stage 1100. The auxiliary member 1250 may be positioned at the right edge or left edge of the stage 1100.

The inkjet head 1300 may suspend/pause the discharge of ink when it is positioned at the left edge of the stage 1100. When the inkjet head 1300 is positioned at the right edge of the stage 1100, the inkjet head 1300 may discharge ink onto the auxiliary member 1250. Accordingly, desirable fluidity of the ink inside the inkjet head 1300 may be maintained.

Figure 11:
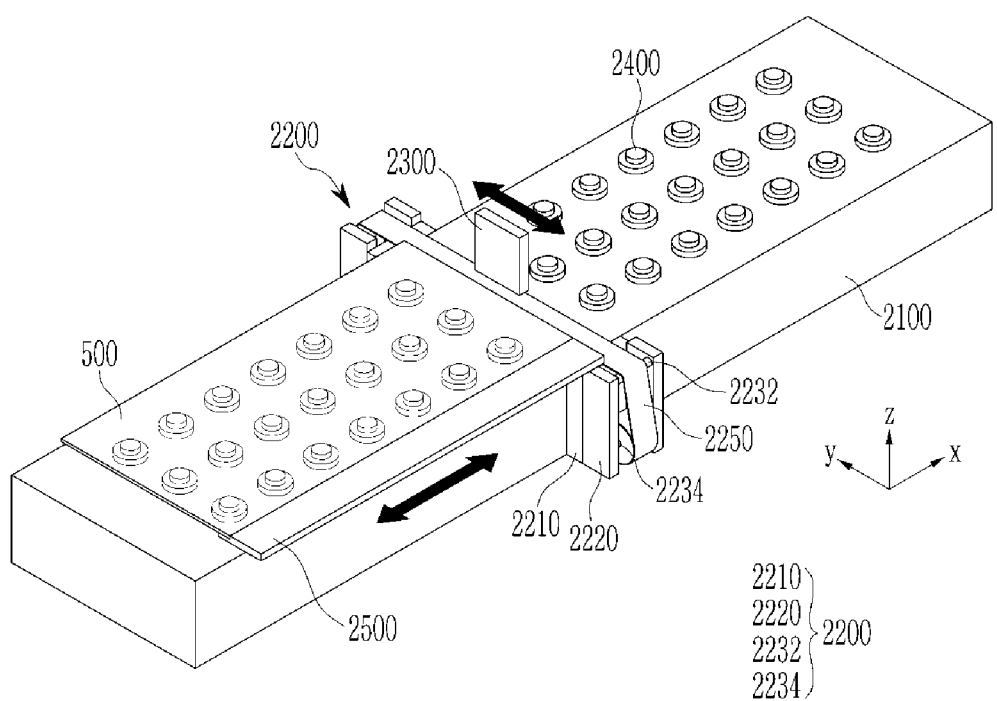
FIG. 11 is a perspective view showing an inkjet printing apparatus according to an embodiment.

FIG. 11 is a perspective view showing an inkjet printing apparatus according to an embodiment. Some features related to the inkjet printing apparatus shown in FIG. 11 may be identical to or analogous to some features described with reference to one or more of FIGS. 1 to 7.

Referring to FIG. 11, an inkjet printing apparatus includes a stage 2100, an auxiliary member 2250 positioned on the stage 2100, and an inkjet head 2300 that is movable on the stage 2100 and the auxiliary member 2250.

The substrate 500 may move relative to the stage 2100 when floating over the stage 2100.

The inkjet printing apparatus may further include holes 2400 (e.g., airflow-controlling holes 2400) positioned on the stage 2100 for controlling the movement of the substrate 500. The holes 2400 may be disposed in a matrix form in a first direction x and a second direction y. The substrate 500 may be positioned over/on some of the holes 2400. At least some holes 2400 underlying the substrate 500 may output air to provide pressure for floating the substrate 500 to be spaced from the stage 2100 by a predetermined distance. Some hole 2400 may suck in air to cause the substrate 500 may be fixed on the stage 2100 by the pressure of the atmosphere.

The inkjet printing apparatus may further include a substrate moving member 2500 for moving the substrate 500 when the substrate is floating. Although not shown, the substrate moving member 2500 may be connected to a rail and may move in the first direction x along the rail. One edge of the substrate 500 may be fixed on the substrate moving member 2500 after the substrate 500 is levitated, and the substrate moving member 2500 may move the substrate 500 in the first direction x.

The inkjet printing apparatus may include a driving unit (not shown) for generating a driving force for moving the substrate moving member 2500 may be provided. The driving unit may move the substrate moving member 2500 using at least one of a mechanical force, an electric force, and a magnetic force.

The upper face of the stage 2100 may have about twice the size/length of the substrate 500. On the stage 2100, the substrate 500 may move in the first direction x.

The auxiliary member 2250 may be positioned at the center of the stage 2100. When the substrate 500 is moved to the left edge in the first direction x, the substrate 500 may not overlap the auxiliary member 2250. When the substrate 500 is moved to the right edge in the first direction x, the substrate 500 may not overlap the auxiliary member 2250. In the process of the substrate 500 moving from one edge to the other edge on the stage 2100, the substrate 500 may overlap the auxiliary member 2250.

The inkjet head 2300 may move in the second direction y, and may not move in the first direction x. The inkjet head 2300 may keep overlapping the auxiliary member 2250. The auxiliary member 2250 may extend lengthwise in the second direction y, and the inkjet head 2300 may move in the second direction y over the auxiliary member 2250.

As the substrate 500 moves over the auxiliary member 2250, the substrate 500 may be positioned between the inkjet head 2300 and the auxiliary member 2250, and the ink discharged from the inkjet head 2300 may fall on the substrate 500 to form the pattern. When the substrate 500 is not positioned between the inkjet head 2300 and the auxiliary member 2250, the ink discharged from the inkjet head 2300 may fall on the auxiliary member 2250. The inkjet head 2300 provides ink to the auxiliary member 2250 when not providing ink to the substrate 500. Advantageously, the ink inside the inkjet head 2300 may continuously flow and maintain desirable fluidity.

The auxiliary member 2250 may be fixed by one or more fixing members 2200 positioned at one or more sides of the stage 2100. A fixing member 2200 may include a first roller 2232, a second roller 2234, a supporting member 2220, and a transferring member 2210.

The inkjet printing apparatus may include two fixing members 2200 positioned at opposite sides of the stage 2100 for fixing one auxiliary member 2250. When one fixing member 2200 winds the auxiliary member 2250, the other fixing member 2200 may unwind the auxiliary member 2250, such that a portion of the auxiliary member 2250 may move in the second direction y over the stage 2100.

FIGS. 12 to 15 are perspective views showing an inkjet printing process according to an embodiment.

Figure 12:
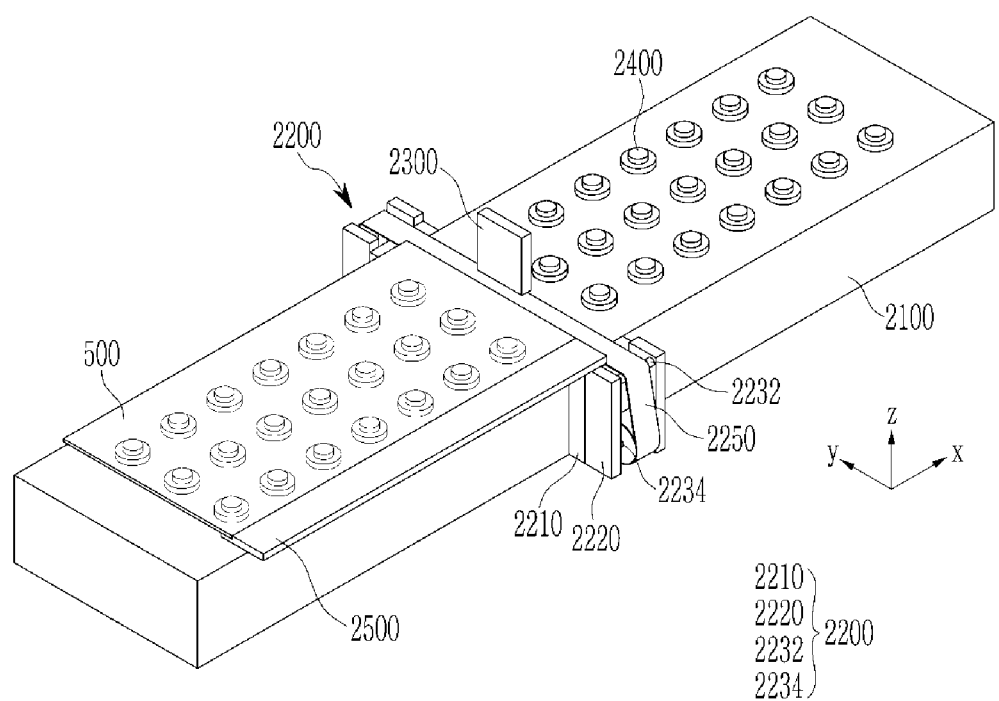
FIG. 12, FIG. 13, FIG. 14, and FIG. 15 are perspective views showing an inkjet printing process according to an embodiment.

Referring to FIG. 12, an inkjet head 2300 may keep overlapping an auxiliary member 2250 when forming a pattern on a substrate 500 by an inkjet printing method. The auxiliary member 2250 may extend lengthwise in the second direction y. The substrate 500 may be positioned on the left half of the stage 2100 and may expose the auxiliary member 2250 to the inkjet head 2300.

The inkjet head 2300 may discharge ink onto the auxiliary member 2250 when the inkjet head 2300 does not overlap the substrate 500. Therefore, the inkjet printing process may be performed with desirable fluidity of the ink.

Figure 13:
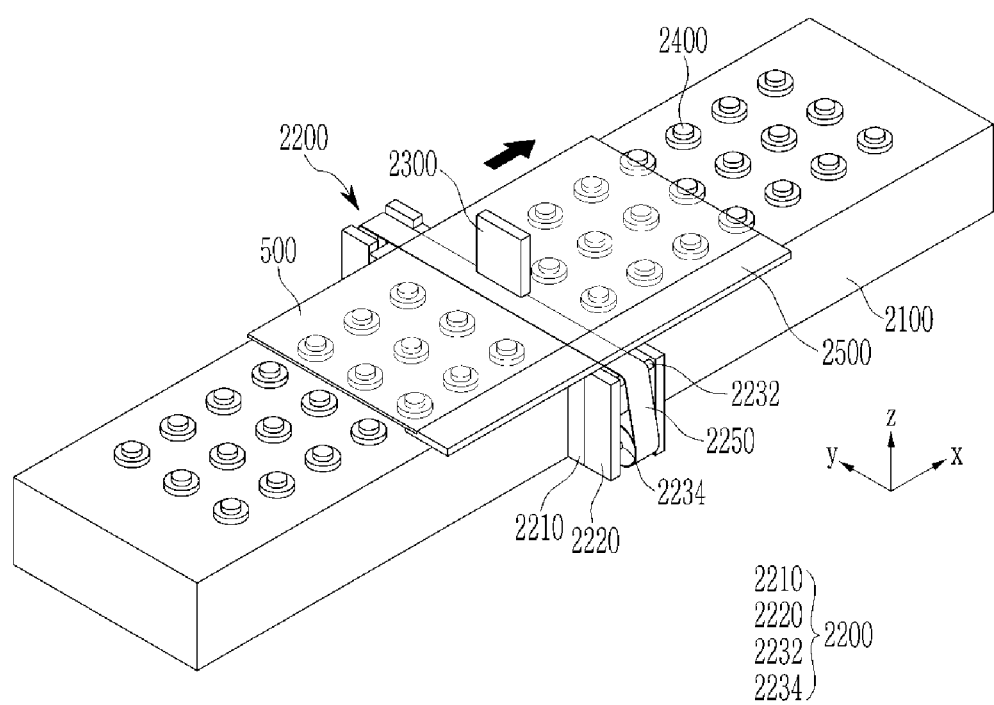

Referring to FIG. 13, when the substrate moving member 2500 moves in the first direction x, the substrate 500 may be moved in the first direction x. The substrate 500 may be positioned between the inkjet head 2300 and the auxiliary member 2250. The ink is discharged from the inkjet head 2300 onto the substrate 500, and a strip of a predetermined pattern may be formed on the substrate 500 by the discharged ink through the movement of the substrate 500. The inkjet head 2300 may move in the second direction y for forming multiple strips of the pattern to complete the pattern on the substrate 500. By forming the pattern on the substrate 500 with desirable fluidity of the ink, the portion of the pattern formed at the beginning of the inkjet printing process may have substantially the same characteristics as other portions of the pattern. Accordingly, the uniformity of the pattern formed on the substrate 500 may be satisfactory.

Figure 14:
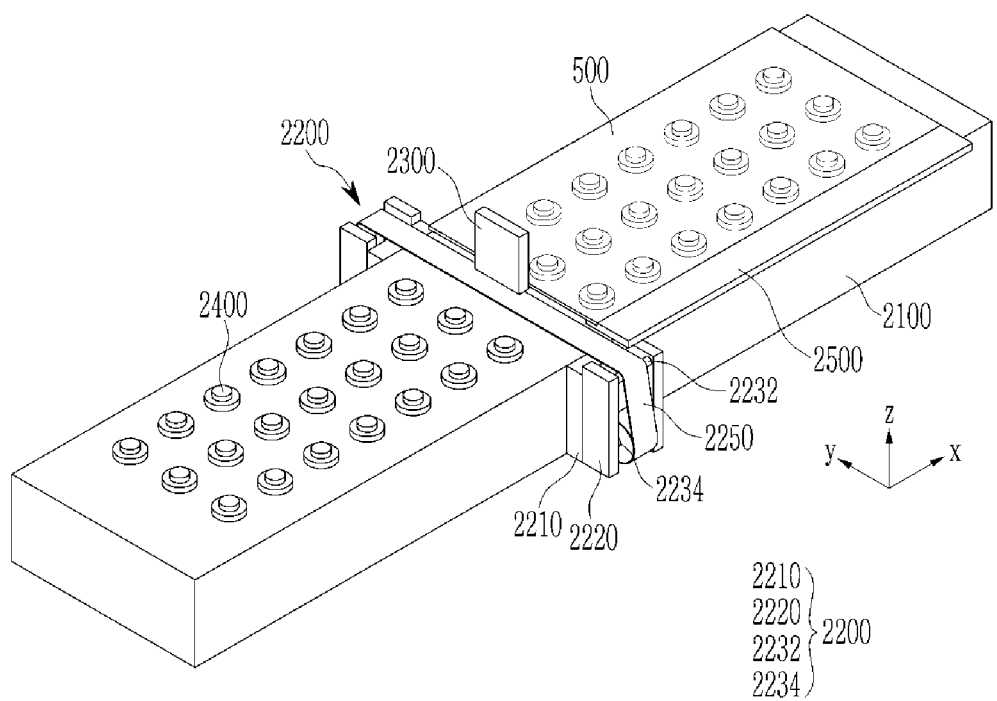

Referring to FIG. 14, when the substrate moving member 2500 has moved the substrate 500 in the first direction x past the auxiliary member 2500 to the right side of the stage 2100, the substrate 500 may not block the auxiliary member 2250 from the inkjet head 2300.

The inkjet head 2300 may provide ink to the auxiliary member 2250 without stopping discharging ink. The ink discharge may continue even when the inkjet head 2300 does not overlap the substrate 500. Therefore, desirable fluidity of the ink inside the inkjet head 2300 may be maintained.

Figure 15:
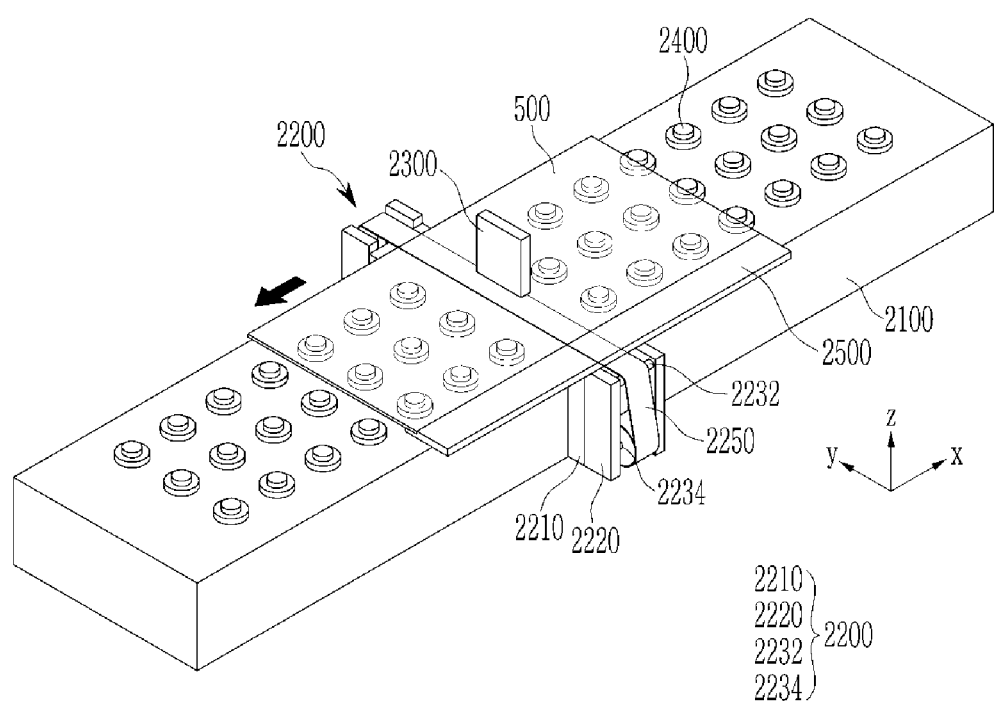

Referring to FIG. 15, when the substrate moving member 2500 moves leftward in the first direction x, the substrate 500 may be moved leftward in the first direction x. For forming additional features in the same strip of the pattern on the substrate 500, the inkjet head 2300 may remain at the same position as in FIG. 13. For forming another strip of the pattern on the substrate 500, the inkjet head 2300 may be at a position different from the position of the inkjet head 2300 in FIG. 13. The substrate 500 may be positioned between the inkjet head 2300 and the auxiliary member 2250. The ink is discharged from the inkjet head 2300 onto the substrate 500, and additional features or a new strip of the predetermined pattern may be formed on the substrate 500 by the discharged ink.

By forming the pattern on the substrate 500 after the inkjet head 2300 discharges the ink onto the auxiliary member 2250, the portion of the pattern formed after the movement direction change of the substrate 500 may have substantially the same characteristics as other portions of the pattern. Accordingly, the uniformity of the pattern formed on the substrate 500 may be satisfactory.

Although not shown, the position of the inkjet head 2300 may be changed in the process of changing the movement direction of the substrate 500. The inkjet head 230 may move forward in the second direction y along the auxiliary member 2250.

Figure 16:
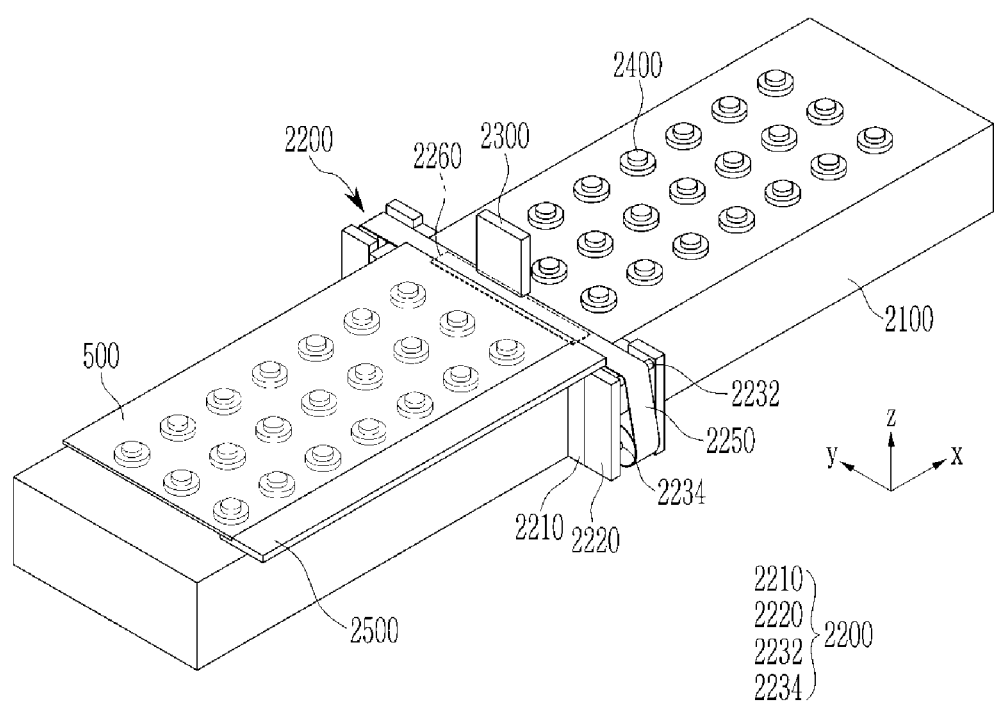
FIG. 16 is a perspective view showing an inkjet printing apparatus according to an embodiment.

FIG. 16 is a perspective view showing an inkjet printing apparatus according to an embodiment. Some features related to the inkjet printing apparatus shown in FIG. 16 may be identical to or analogous to some features described with reference to one or more of FIGS. 1 to 15.

Referring to FIG. 16, the inkjet printing apparatus includes a stage 2100, an auxiliary member 2250 positioned on the stage 2100, and an inkjet head 2300 that is movable on the stage 2100 and the auxiliary member 2250.

The inkjet printing apparatus may further include a securing member 2260 positioned on the stage 2100.

The securing member 2260 may be positioned between stage 2100 and auxiliary member 2250. The securing member 2260 may suck in the air between the stage 2100 and the auxiliary member 2250 so that the auxiliary member 2250 is attached to the stage 2100. The auxiliary member 2250 may be substantially thin and may be affected by the surrounding airflow. The securing member 2260 may secure the auxiliary member 2250 in place and may prevent the auxiliary member 2250 from falling off the stage 2100. The securing member 2260 may secure the auxiliary member 2250 in place when ink falls on the auxiliary member 2250. The securing member 2260 may release the auxiliary member 2250 when or immediately before the auxiliary member 2250 is moved in the second direction y so that the auxiliary member 2250 may be separated from the stage 2100.

The securing member 2260 may include at least one of a vacuum chuck, a porous chuck, an electrostatic chuck, an adhesive chuck, and the like.

Figure 17:
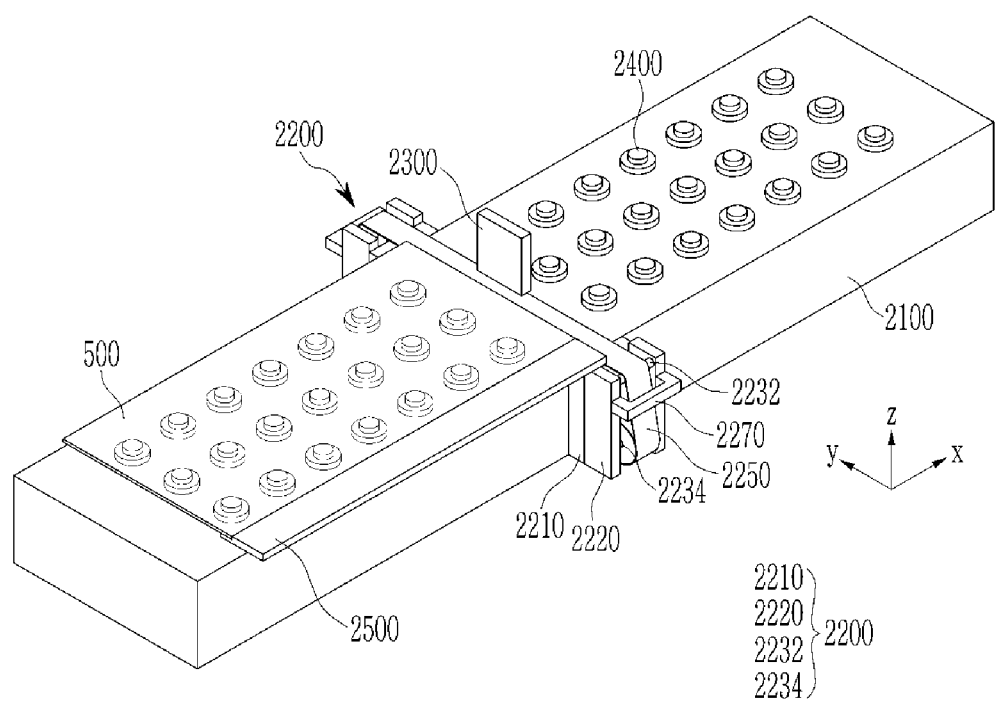
FIG. 17 is a perspective view showing an inkjet printing apparatus according to an embodiment.

FIG. 17 is a perspective view showing an inkjet printing apparatus according to an embodiment. Some features related to the inkjet printing apparatus shown in FIG. 17 may be identical to or analogous to some features described with reference to one or more of FIGS. 1 to 16.

Referring to FIG. 17, the inkjet printing apparatus includes a stage 2100, an auxiliary member 2250 positioned on the stage 2100, and an inkjet head 2300 that is movable on the stage 2100 and the auxiliary member 2250.

The auxiliary member 2250 may be supported and/or fixed by one or more fixing members 2200 positioned at one or more sides of the stage 2100. The inkjet printing apparatus may further include a drying member 2270 attached to a fixing member 2200.

The drying member 2270 may be fixed to two supporting members 2220 of the fixing member 2200. The drying member 2270 may be positioned at a height/position between the first roller 2232 and the second roller 2234 or at an alternative position significantly spaced from the inkjet head 1300.

The drying member 2270 may irradiate ultraviolet rays and/or infrared rays for facilitating and/or accelerating drying of ink on the auxiliary member 2250.

One or two drying members 2270 may be formed on one or both of two fixing members 2200. The movement direction of the auxiliary member 2250 may be the backward direction or the forward direction, a drying member 2270 may be formed on one of the two fixing members 2200, and no drying member 2270 may be formed on the other one of the two fixing members 2200.

While examples of embodiments have been described, practical embodiments are not limited to the described embodiments. Practical embodiments cover various modifications and equivalent arrangements within the scope of the appended claims.

What is claimed is:

1. An inkjet printing apparatus for forming a material layer on a substrate, the inkjet printing apparatus comprising:
   a stage for supporting the substrate;
   a first ink-receiving member;
   an inkjet head overlapping at least one of the stage and the first ink-receiving member, configured to provide a first set of ink to the substrate, and configured to provide a second set of ink to the first ink-receiving member when the substrate is supported by the stage;
   a first fixing member neighboring the stage and at least partially supporting the first ink-receiving member; and
   a second fixing member partially supporting the first ink-receiving member,
   wherein the stage is positioned between the first fixing member and the second fixing member.

2. The inkjet printing apparatus of claim 1, further comprising: a second ink-receiving member, wherein the stage is configured to support the substrate between the first ink-receiving member and the second ink-receiving member, and wherein the inkjet head is configured to provide a third set of ink to the second ink-receiving member when the substrate is positioned on the stage.

3. The inkjet printing apparatus of claim 1, wherein at least one of the stage and the inkjet head is capable of moving in at least one of a first direction and a second direction perpendicular to the first direction.

4. The inkjet printing apparatus of claim 3, wherein the inkjet head discharges no ink on the substrate when providing the second set of ink to the first ink-receiving member.

5. The inkjet printing apparatus of claim 3, further comprising: a securing member positioned between the stage and the first ink-receiving member for securing a section of the first ink-receiving member in place on the stage, wherein the securing member is configured to release the section of the first ink-receiving member from the stage.

6. The inkjet printing apparatus of claim 5, wherein the securing member includes at least one of a vacuum chuck, a porous chuck, an electrostatic chuck, and an adhesive chuck.

7. The inkjet printing apparatus of claim 6 1, wherein the first fixing member unwinds the first ink-receiving member when the second fixing member winds the first ink-receiving member.

8. The inkjet printing apparatus of claim 5 1, wherein the first fixing member includes:
a first roller contacting the first ink-receiving member,
a second roller contacting the first-ink receiving member,
a supporting member supporting the first roller and the second roller, and
a transferring member for moving the supporting member relative to the stage in a third direction perpendicular to the first direction and the second direction.

9. The inkjet printing apparatus of claim 8, further comprising: a drying member attached to the first fixing member, positioned farther from the inkjet head than the first ink-receiving member, and configured to facilitate drying of the second set of ink.

10. The inkjet printing apparatus of claim 9, wherein the drying member irradiates ultraviolet rays or infrared rays.

11. The inkjet printing apparatus of claim 1, wherein the first ink-receiving member is positioned between an edge of the stage and the substrate when the substrate is supported by the stage.

12. The inkjet printing apparatus of claim 1, further comprising: holes positioned on the stage for changing an amount of air between the stage and the substrate, wherein the first ink-receiving member is positioned two opposite edges of the stage.

13. The inkjet printing apparatus of claim 12, wherein the substrate overlaps a first subset of the holes, exposes a second subset of the holes, and is levitated from the stage or attached to the first subset of holes according to an operation of the first subset of holes.

14. The inkjet printing apparatus of claim 13, further comprising: a substrate moving member fixed to at least one edge of the substrate and moving the substrate in a first direction, wherein the inkjet head moves in a second direction perpendicular to the first direction.

15. The inkjet printing apparatus of claim 14, wherein when the substrate is positioned between the inkjet head and the first ink-receiving member, the inkjet head discharges the first set of ink on the substrate, and wherein when the substrate exposes the first ink-receiving member to the inkjet head, the inkjet head discharges the second set of ink on the first ink-receiving member.

16. The inkjet printing apparatus of claim 13, further comprising:
a first fixing member supporting a first section of the first ink-receiving member; and
a second fixing member supporting a second section of the first ink-receiving member,
wherein a third section of the first ink-receiving member moves over the stage when the first fixing member unwinds the first section of the first ink-receiving member and when the second fixing member winds the second section of the first ink-receiving member.

17. The inkjet printing apparatus of claim 16, further comprising: a drying member attached to the first fixing member, positioned farther from the inkjet head than the first ink-receiving member, and configured to facilitate drying of the second set of ink.

18. The inkjet printing apparatus of claim 13, further comprising: a securing member positioned between the stage and the first ink-receiving member, positioned between the first subset of holes and the second subset of holes, and configured to secure the first ink-receiving member in place on the stage.

\* \* \* \* \*